United States Patent
Wu et al.

(10) Patent No.: US 11,469,290 B2
(45) Date of Patent: Oct. 11, 2022

(54) ARRAY SUBSTRATE AND MANUFACTURING METHOD THEREOF

(71) Applicants: Hefei BOE Joint Technology Co., Ltd., Beijing (CN); BOE TECHNOLOGY GROUP CO., LTD., Beijing (CN)

(72) Inventors: Zhongyuan Wu, Beijing (CN); Yongqian Li, Beijing (CN); Can Yuan, Beijing (CN); Meng Li, Beijing (CN); Zhidong Yuan, Beijing (CN); Xuehuan Feng, Beijing (CN); Lang Liu, Beijing (CN); Dacheng Zhang, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 67 days.

(21) Appl. No.: 17/040,260

(22) PCT Filed: Nov. 29, 2019

(86) PCT No.: PCT/CN2019/122197
§ 371 (c)(1),
(2) Date: Sep. 22, 2020

(87) PCT Pub. No.: WO2021/103007
PCT Pub. Date: Jun. 3, 2021

(65) Prior Publication Data
US 2021/0167162 A1  Jun. 3, 2021

(51) Int. Cl.
*H01L 29/08* (2006.01)
*H01L 27/32* (2006.01)

(52) U.S. Cl.
CPC ...... *H01L 27/3276* (2013.01); *H01L 27/3262* (2013.01); *H01L 27/3265* (2013.01); *H01L 2227/323* (2013.01)

(58) Field of Classification Search
CPC ............ H01L 27/3265; H01L 27/3262; H01L 27/3272; H01L 2227/323
(Continued)

(56) References Cited

U.S. PATENT DOCUMENTS 10,504,982 B2 * 12/2019 Lee .................... H01L 27/3262
2019/0326381 A1 * 10/2019 Hou .................... G09G 3/3233
(Continued)

*Primary Examiner* — Phuc T Dang
(74) *Attorney, Agent, or Firm* — Perilla Knox & Hildebrandt LLP; Kenneth A. Knox

(57) ABSTRACT

The present disclosure relates to the field of display technologies, and provides an array substrate, a manufacturing method thereof, and a display panel. In the array substrate, a substrate is provided with a first transistor and a second transistor, a first electrode of the first transistor is electrically connected to a gate of the second transistor; a conductive layer is disposed on the substrate, and includes a first conductor portion, a first semiconductor portion, a second conductor portion that are sequentially connected along a first direction; a first gate insulating layer is disposed on a side of the conductive layer away from the substrate; a first gate layer is disposed on a side of the first gate insulating layer away from the substrate to form the gate of the second transistor; a dielectric layer is disposed on the substrate to cover a part of the first conductor portion, a part of the second conductor portion and a part of the first gate layer, and an orthographic projection of a first via hole disposed on the dielectric layer on the substrate overlaps with orthographic projections of at least a part of the first conductor portion, at least a part of the second conductor portion and the first gate layer on the substrate; and a first source/drain
(Continued)

layer is disposed on a side of the dielectric layer away from the substrate to cover the first via hole.

20 Claims, 14 Drawing Sheets

(58) Field of Classification Search
USPC .......................................................... 257/40
See application file for complete search history.

(56) References Cited

U.S. PATENT DOCUMENTS

2019/0326560 A1\* 10/2019 Cha ..................... H01L 51/5237
2020/0006401 A1\* 1/2020 Hwang ............... H01L 27/1222

\* cited by examiner

ARRAY SUBSTRATE AND MANUFACTURING METHOD THEREOF

CROSS-REFERENCE TO RELATED APPLICATION

This application is a 35 U.S.C. § 371 national phase application of International Application No. PCT/CN2019/122197 filed Nov. 29, 2019, the contents of which being incorporated by reference in their entirety herein.

TECHNICAL FIELD

The present disclosure relates to the field of display technologies, and in particular to an array substrate, a manufacturing method thereof, and a display panel.

BACKGROUND

In the field of OLED (Organic Light-Emitting Diode) displays, with rapid development of high-resolution products, higher requirements are put forward for a structural design of a display substrate, such as arrangement of pixels and signal lines.

SUMMARY

According to an aspect of the present disclosure, there is provided an array substrate, including: a substrate, a conductive layer, a first gate insulating layer, a first gate layer, a dielectric layer, and a first source/drain layer. The substrate includes a first transistor including a first electrode and a second transistor including a gate disposed thereon, and the first electrode of the first transistor is electrically connected to the gate of the second transistor; the conductive layer is disposed on the substrate, and includes a first conductor portion, a first semiconductor portion, and a second conductor portion that are sequentially connected along a first direction, wherein the second conductor portion forms a first electrode contact area of the first transistor; the first gate insulating layer is disposed on a side of the conductive layer away from the substrate, and an orthographic projection of the first gate insulating layer on the substrate and an orthographic projection of the first semiconductor portion on the substrate overlap at an edge in the first direction; the first gate layer is disposed on a side of the first gate insulating layer away from the substrate to form the gate of the second transistor, and an orthographic projection of the first gate layer on the substrate and the orthographic projection of the first semiconductor portion on the substrate overlap at the edge in the first direction; the dielectric layer is disposed on the substrate to cover a part of the first conductor portion, a part of the second conductor portion and a part of the first gate layer, and the dielectric layer is provided with a first via hole, an orthographic projection of the first via hole on the substrate overlaps with orthographic projections of at least a part of the first conductor portion, at least a part of the second conductor portion and the first gate layer on the substrate; the first source/drain layer is disposed on a side of the dielectric layer away from the substrate, and is electrically connected to the first conductor portion, the first gate layer and the second conductor portion, and an orthographic projection of the first source/drain layer on the substrate at least partially overlaps with the orthographic projection of the first via hole on the substrate, wherein the first source/drain layer forms the first electrode of the first transistor; the first conductor portion, the second conductor portion, and the first gate layer are all electrically connected to the first source/drain layer in the first via hole.

In an exemplary embodiment of the present disclosure, the conductive layer further includes a second semiconductor portion coupled to the second conductor portion along the first direction, and a third conductor portion, wherein the second semiconductor portion forms a channel area of the first transistor, the first conductor portion, the first semiconductor portion, the second conductor portion, the second semiconductor portion, and the third conductor portion are sequentially connected along the first direction, and the array substrate further includes a second gate insulating layer and a second gate layer. The second gate insulating layer is disposed on a side of the second semiconductor portion away from the substrate; the second gate layer is disposed on a side of the second gate insulating layer away from the substrate to form a gate of the first transistor.

In an exemplary embodiment of the present disclosure, an orthographic projection of the second gate insulating layer on the substrate and an orthographic projection of the second gate layer on the substrate overlap at the edge in the first direction.

In an exemplary embodiment of the present disclosure, the array substrate further includes a data signal line electrically connected to a second electrode of the first transistor; the third conductor portion forms the second electrode of the first transistor.

In an exemplary embodiment of the present disclosure, the array substrate further includes a storage capacitor, and the first electrode of the first transistor is electrically connected to a first capacitor electrode of the storage capacitor and the gate of the second transistor, a first electrode of the second transistor is electrically connected to a second capacitor electrode of the storage capacitor; wherein the first conductor portion forms the first capacitor electrode.

In an exemplary embodiment of the present disclosure, the array substrate further includes a second source/drain layer disposed in a same layer as the first source/drain layer to form the second capacitor electrode of the storage capacitor; wherein an orthographic projection of the second source/drain layer on the substrate at least partially overlaps with an orthographic projection of the first conductor portion on the substrate.

In an exemplary embodiment of the present disclosure, the array substrate further includes a light-shielding metal layer disposed on a side of the conductive layer facing the substrate; a buffer layer formed on a side of the light-shielding metal layer away from the substrate; wherein an orthographic projection of the light-shielding metal layer on the substrate at least partially overlaps with the orthographic projection of the first conductor portion on the substrate; the light-shielding metal layer forms a third capacitor electrode of the storage capacitor.

In an exemplary embodiment of the present disclosure, an orthographic projection of the second source/drain layer on a plane where the first conductor portion is located is at least partially located outside the first conductor portion; an orthographic projection of the light-shielding metal layer on the plane where the first conductor portion is located is at least partially located outside the first conductor portion, and an orthographic projection of the light-shielding metal layer on the second source/drain layer at least partially overlaps with the second source/drain layer; the second source/drain layer and the light-shielding metal layer are electrically connected by a second via hole that penetrates the dielectric layer and the buffer layer.

In an exemplary embodiment of the present disclosure, the second capacitor electrode of the storage capacitor formed by the second source/drain layer is electrically connected to the third capacitor electrode of the storage capacitor formed by the light-shielding metal layer.

In an exemplary embodiment of the present disclosure, the conductive layer further includes a fourth conductor portion connected between the first conductor portion and the second conductor portion.

In an exemplary embodiment of the present disclosure, the array substrate further includes a storage capacitor, and the first electrode of the first transistor is electrically connected to a first capacitor electrode of the storage capacitor and the gate of the second transistor; the second electrode of the first transistor is configured to receive a data signal provided by a data signal line, the gate of the first transistor is configured to receive a first control signal provided by a first control signal line, and the first transistor is configured to write the data signal into the gate of the second transistor and the storage capacitor in response to the first control signal; the first electrode of the second transistor is electrically connected to the second capacitor electrode of the storage capacitor, and is configured to be electrically connected to a light emitting element; the second electrode of the second transistor is configured to receive a first power voltage provided by a first power voltage signal, and the second transistor is configured to control a current for driving the light emitting element under control of a voltage of the gate of the second transistor.

In an exemplary embodiment of the present disclosure, the first semiconductor portion includes indium gallium zinc oxide, and the first conductor portion and the second conductor portion include hydrogen ionized indium gallium zinc oxide.

According to an aspect of the present disclosure, there is provided an array substrate, including: a substrate and a plurality of sub-pixels located on the substrate, wherein the plurality of sub-pixels are arranged in a sub-pixel array, and the sub-pixel array is arranged along a first direction and a second direction intersecting with the first direction; at least one of the sub-pixels includes a second transistor, a first transistor, and a storage capacitor on the substrate; a first electrode of the first transistor is electrically connected to a first capacitor electrode of the storage capacitor and a gate of the second transistor; a second electrode of the first transistor is configured to receive a data signal, a gate of the first transistor is configured to receive a first control signal, and the first transistor is configured to write the data signal into the gate of the second transistor and the storage capacitor in response to the first control signal; a first electrode of the second transistor is electrically connected to a second capacitor electrode of the storage capacitor, and is configured to be electrically connected to a light emitting element; a second electrode of the second transistor is configured to receive a first power voltage, and the second transistor is configured to control a current for driving the light emitting element under control of a voltage of the gate of the second transistor; the second capacitor electrode and the first electrode of the first transistor are insulated in a same layer and having a same material; the gate of the second transistor includes an extension portion protruding in a second direction, and the extension portion and the first electrode of the first transistor at least partially overlap in a direction perpendicular to the substrate and are electrically connected; an active layer of the first transistor includes a first electrode contact area, a second electrode contact area, and a channel area between the first electrode contact area and the second electrode contact area; the first electrode of the first transistor is electrically connected to the first electrode contact area, the extension portion, and the first capacitor electrode by a first via hole, respectively.

In an exemplary embodiment of the present disclosure, the first via hole extends along the first direction and exposes a surface of the extension portion and at least a part of two opposite sides of the extension portion in the first direction.

In an exemplary embodiment of the present disclosure, the two sides of the extension portion are coated with the first electrode of the first transistor through the first via hole.

In an exemplary embodiment of the present disclosure, the array substrate further includes a third transistor, a first electrode of the third transistor is coupled to the first electrode of the second transistor, a second electrode of the third transistor is coupled to a sensing signal terminal, and a gate of the third transistor is used for connecting the sensing signal terminal and the first electrode of the second transistor under action of a second control signal.

In an exemplary embodiment of the present disclosure, the storage capacitor further includes a third capacitor electrode which is short-circuited with the second capacitor electrode.

According to an aspect of the present disclosure, there is provided a manufacturing method for an array substrate, wherein the manufacturing method for the array substrate includes:

forming a substrate, wherein the substrate includes a first transistor including a first electrode and a first electrode contact area, and a second transistor including a gate disposed thereon, and the first electrode of the first transistor is electrically connected to the gate of the second transistor;

forming a conductive layer on the substrate, wherein the conductive layer is disposed on the substrate, and includes a first conductor portion, a first semiconductor portion, and a second conductor portion that are sequentially connected along a first direction, wherein the second conductor portion forms a first electrode contact area of the first transistor;

forming a first gate insulating layer on a side of the conductive layer away from the substrate, wherein an orthographic projection of the first gate insulating layer on the substrate and an orthographic projection of the first semiconductor portion on the substrate overlap at an edge in the first direction;

forming a first gate layer on a side of the first gate insulating layer away from the substrate, wherein the first gate layer forms the gate of the second transistor, and an orthographic projection of the first gate layer on the substrate and the orthographic projection of the first semiconductor portion on the substrate overlap at the edge in the first direction;

forming a dielectric layer on the substrate to cover the first conductor portion, the second conductor portion and the first gate layer;

forming a first via hole on the dielectric layer, wherein an orthographic projection of the first via hole on the substrate overlaps with orthographic projections of at least a part of the first conductor portion, at least a part of the second conductor portion and the first gate layer on the substrate;

forming a first source/drain layer on a side of the dielectric layer away from the substrate, wherein the first source/drain layer is electrically connected to the first conductor portion, the first gate layer and the second conductor portion, and an orthographic projection of the first source/drain layer on the substrate at least partially overlaps with the orthographic projection of the first via hole on the substrate.

According to an aspect of the present disclosure, there is provided a display panel including the above-mentioned array substrate.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is understood that the drawings in the following description show only some of the embodiments of the present disclosure, and other drawings may be obtained by those skilled in the art without departing from the drawings described herein.

DETAILED DESCRIPTION

Figure 1:
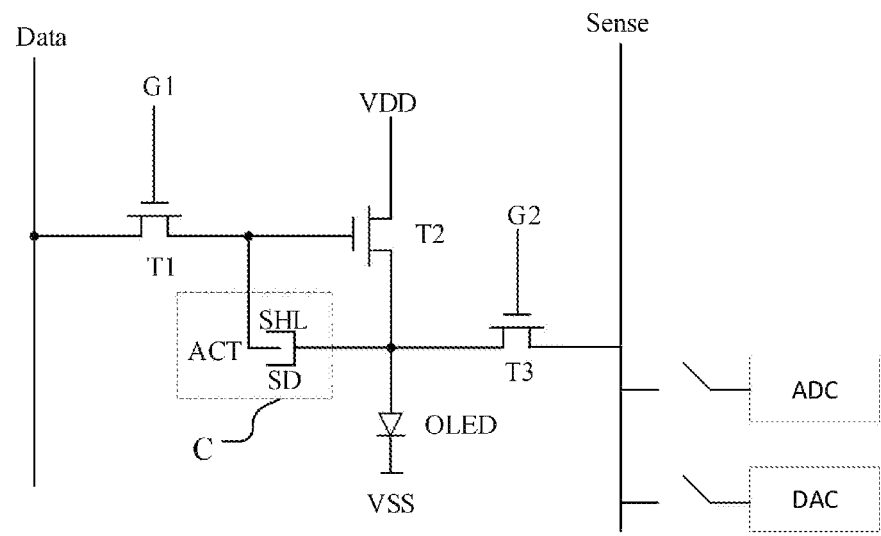
FIG. 1 is a schematic structural diagram of a pixel driving circuit provided by at least one exemplary embodiment of the present disclosure.

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference numerals in the drawings denote the same or similar parts, and the repeated description thereof will be omitted.

Although the relative terms such as "above" and "below" are used in the specification to describe the relative relationship of one component of the icon to another component, these terms are only for convenience in this specification, for example, according to an exemplary direction shown in the drawings. It will be understood that if the device of the icon is flipped upside down, the component described "above" will become the component "below". Other relative terms, such as "high", "low", "top", "bottom", "left", "right", etc., also have similar meanings. When a structure is "on" another structure, it may mean that a structure is integrally formed on another structure, or that a structure is "directly" disposed on another structure, or that a structure is "indirectly" disposed on another structure through other structures.

The terms "one", "a", "the", and "said" are used to indicate that there are one or more elements/components or the like; the terms "include" and "have" are used to indicate an open meaning of including and means that there may be additional elements/components/etc. in addition to the listed elements/components/etc.

FIG. 1 is a schematic structural diagram of a pixel driving circuit provided by at least one exemplary embodiment of the present disclosure. As shown in FIG. 1, the pixel driving circuit includes a first transistor T1, a second transistor T2, a storage capacitor C, and a third transistor T3. The storage capacitor C includes an electrode SD, an electrode SHL, and an electrode ACT. The electrode SD and the electrode SHL are electrically connected to form two parallel capacitor structures. A first terminal of the first transistor T1 is coupled to a data signal terminal Data, and a gate is coupled to a gate driving signal terminal G1; a gate of the second transistor T2 is coupled to a second terminal of the first transistor, and a first terminal of the second transistor T2 is coupled to a power signal terminal VDD, a second terminal of the second transistor T2 is coupled to a light emitting unit OLED; the storage capacitor C is connected between the gate and the second terminal of the second transistor T2; a gate of the third transistor T3 is coupled to a sensing driving signal terminal G2, a first terminal of the third transistor T3 is coupled to a sensing signal terminal Sense, and a second terminal of the third transistor T3 is coupled to the second terminal of the second transistor T2. The sensing signal terminal Sense can be used for sensing an output current of the second transistor T2 when the second transistor T2 is turned on, so as to detect a threshold voltage and mobility of the second transistor T2. A driving method of the pixel driving circuit shown in FIG. 1 generally includes a data writing stage and a light-emitting stage. In the data writing stage: the data signal terminal Data inputs a data signal to the gate of the second transistor T2 through the first transistor T1, which is stored in the storage capacitor C. In addition, the sensing signal terminal Sense can also input an initial signal to a source of the second transistor T2 through the third transistor T3. In the light-emitting stage: the second transistor T2 is turned on under action of an electrode ACT terminal of the storage capacitor C, to drive the light-emitting unit OLED to emit light by the power signal terminal VDD. The second transistor outputs a current I=w $(Vg-Vs-Vth)^2$, where w is the mobility of the second transistor, Vg is a gate voltage of the second transistor, and Vs is a source voltage of the second transistor. Since the source and gate of the second transistor T2 are coupled to two ends of the storage capacitor C, although the source voltage of the second transistor T2 rises during the light-emitting stage, the gate of the second transistor T2 may also rise by a same voltage under bootstrap action of the storage capacitor C. That is, the voltage difference between the gate and source of the second transistor T2 in the light-emitting stage is equal to the voltage difference between the gate and the source in the data writing stage. Therefore, brightness of the light-emitting unit can be controlled only by controlling the data signal terminal Data. An analog-to-digital converter ADC is used for converting an analog signal on the sensing signal terminal Sense, and a digital-to-analog converter DAC is used for converting a digital signal to input the analog signal to the sensing signal terminal Sense.

Figure 2:
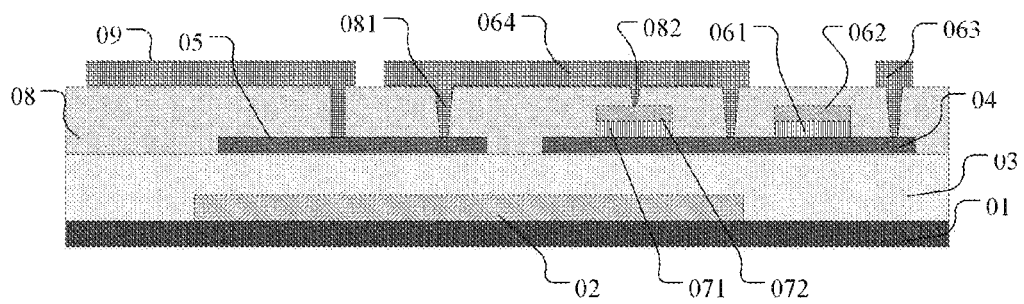
FIG. 2 is a partial cross-sectional view of an array substrate provided by at least one exemplary embodiment of the present disclosure.

FIG. 2 is a partial cross-sectional view of an array substrate provided by at least one exemplary embodiment of the present disclosure. As shown in FIG. 2, the array substrate includes a substrate 01, a light-shielding metal layer 02, a buffer layer 03, a first conductor layer 04, and a second conductor layer 05 disposed in a same layer, a gate insulating layer 061, 071, a gate 062, 072, a dielectric layer 08, via holes 081, 082, and a source/drain 063, 064, 09. The source/drain 063, the gate insulating layer 061, the gate 062, the source/drain 064, and a part of the first conductive layer 04 form the first transistor T1. The gate 72 forms the gate of the second transistor T2, the second conductive layer 05 forms the electrode ACT of the storage capacitor C, the source/drain 09 forms a source/drain of the second transistor T2, and a part of the source/drain 09 can also form another electrode SD of the storage capacitor C; the light-shielding metal layer 02 can be electrically connected to the source/drain 09 through the via hole on the dielectric layer 08, so that a part of the light-shielding metal layer 02 forms the electrode SHL of the storage capacitor C. In the related art, as shown in FIG. 2, the dielectric layer 08 is generally provided with a first via hole 081 and a second via hole 082, the source/drain 064 is electrically connected to the second conductor layer 05 through the first via hole 081, and the source/drain 064 is electrically connected to the gate 072 through the second via hole 082.

However, since two via holes are required to be disposed in this exemplary embodiment, an arrangement area of the capacitor electrode 05 is reduced, resulting in a small capacitance value of the storage capacitor C in the pixel driving circuit. Since the gate 062 and the source/drain 064 of the first transistor T1 form a capacitor structure, when the voltage of G1 decreases, the gate voltage of the second transistor T2 may also decrease under the action of capacitor bootstrap. When the capacitance value of the storage capacitor C itself is small, the above-mentioned voltage drop will cause an abnormal display.

Figure 3:
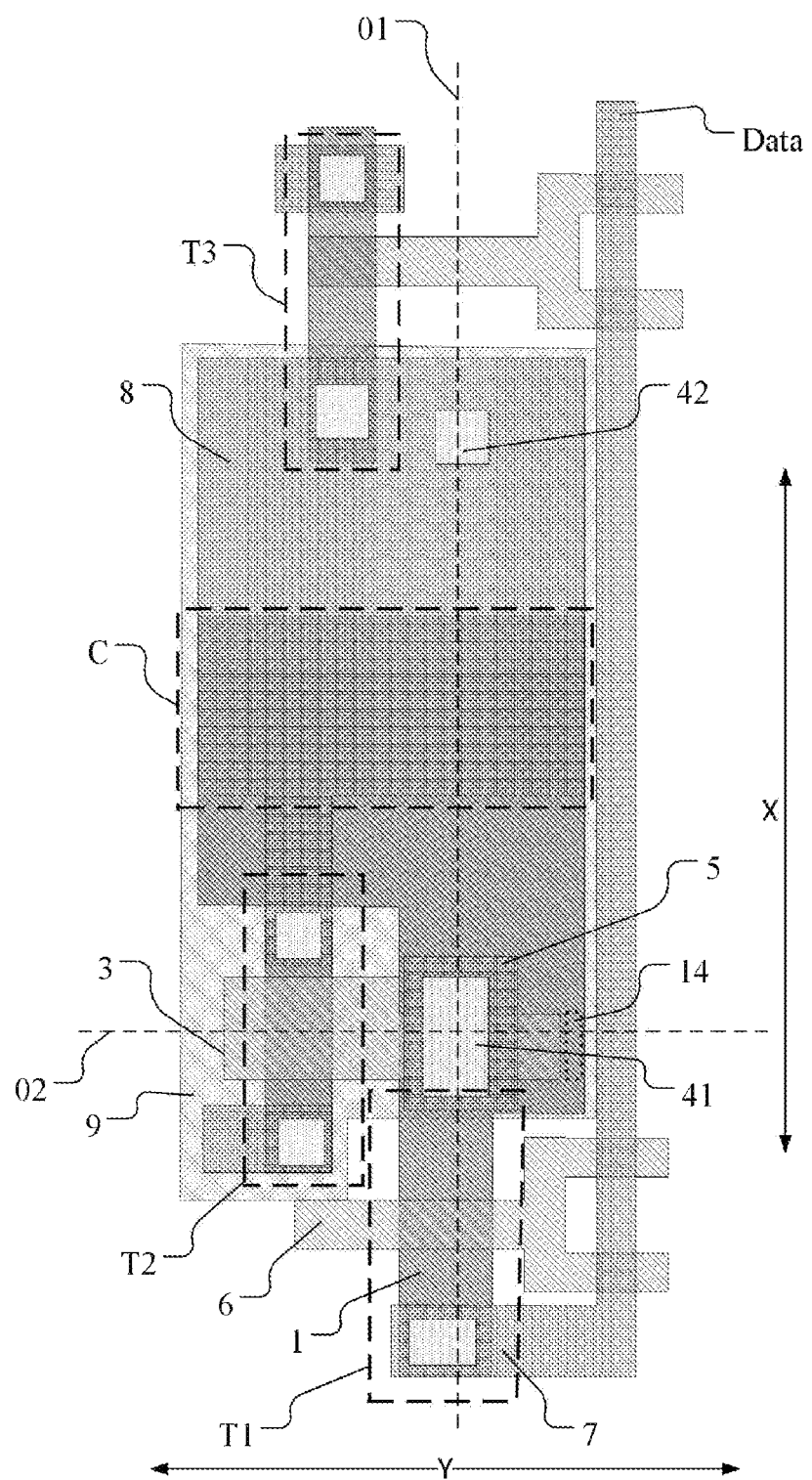
FIG. 3 is a schematic structural diagram of at least one exemplary embodiment of an array substrate of the present disclosure.
Figure 3A:
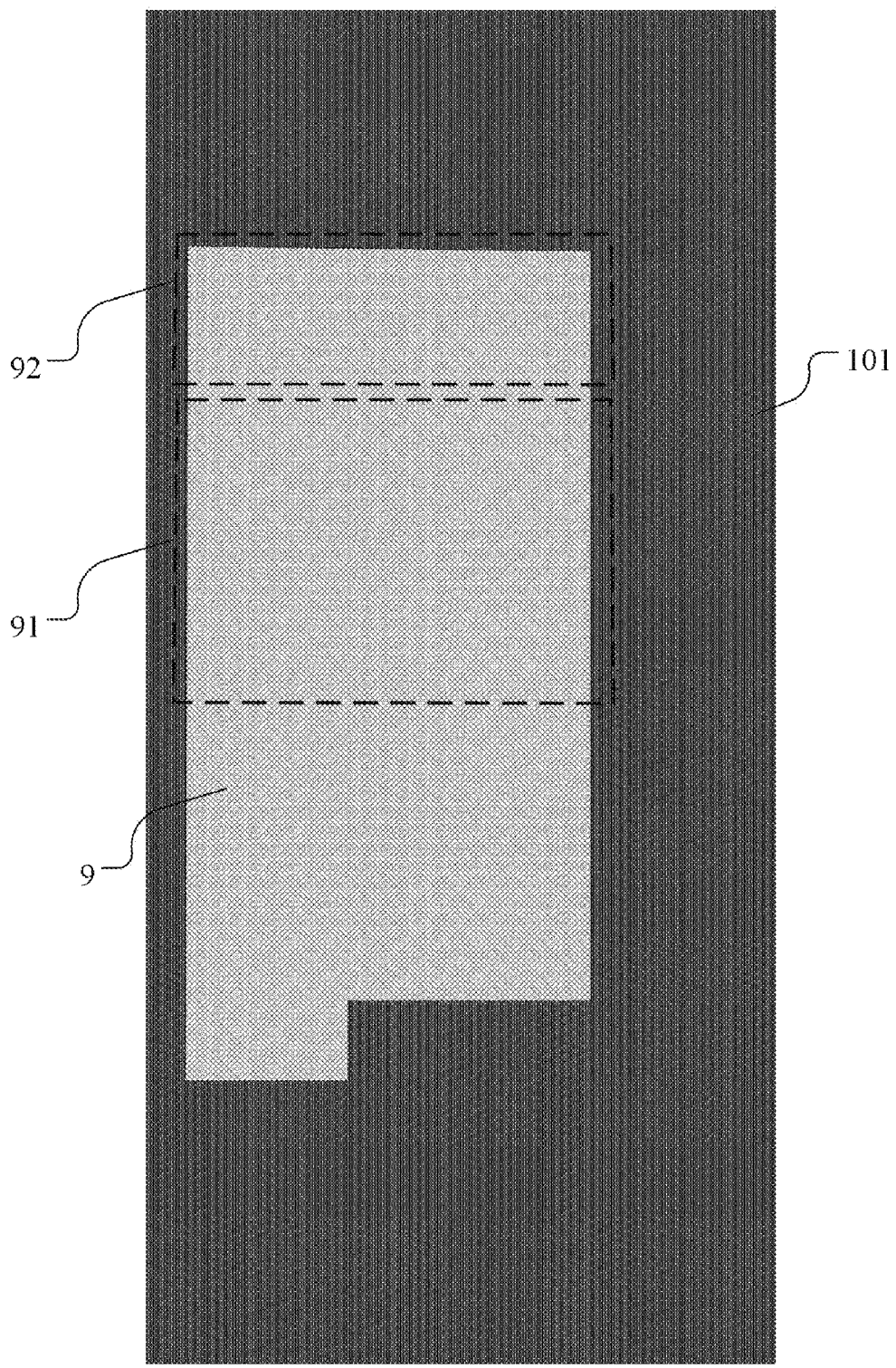
FIGS. 3a-3g are top views of each layer of FIG. 3.
Figure 3B:
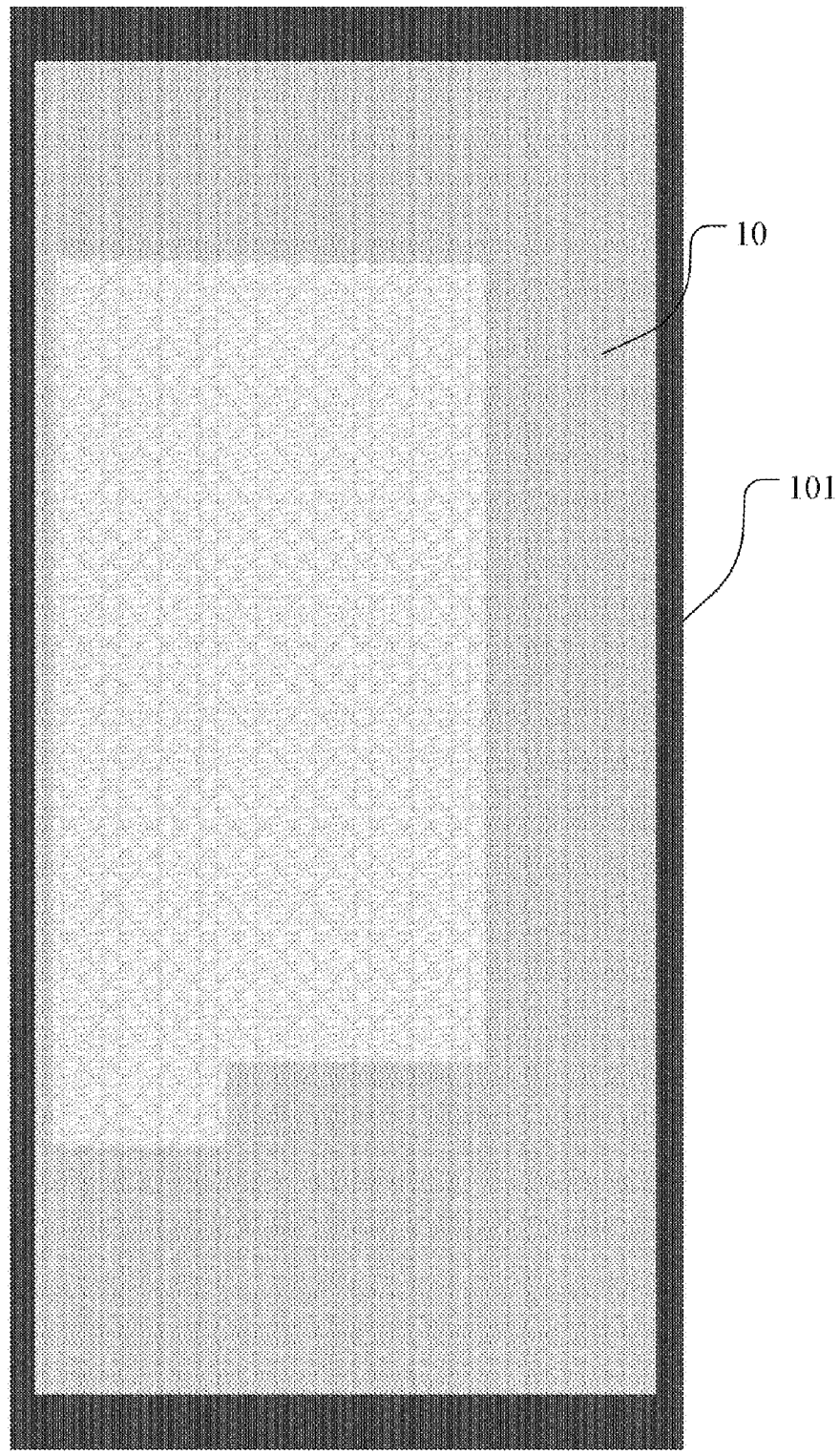
Figure 4:
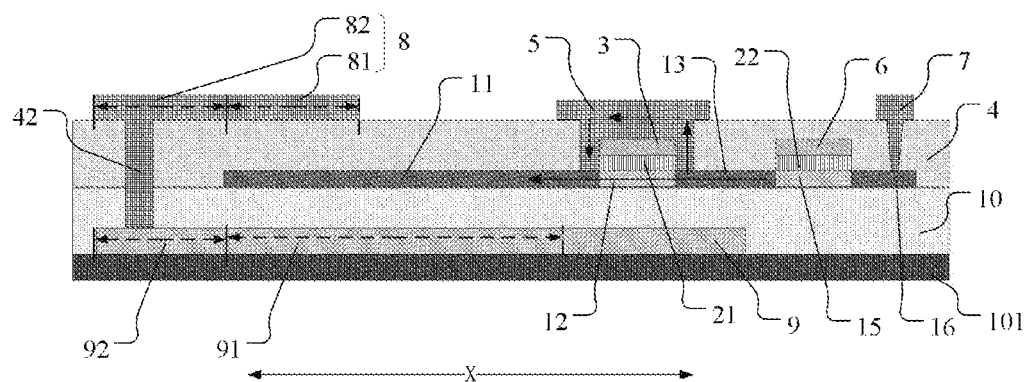
FIG. 4 is a cross-sectional view along a dashed line 01 in FIG. 3.
Figure 5:
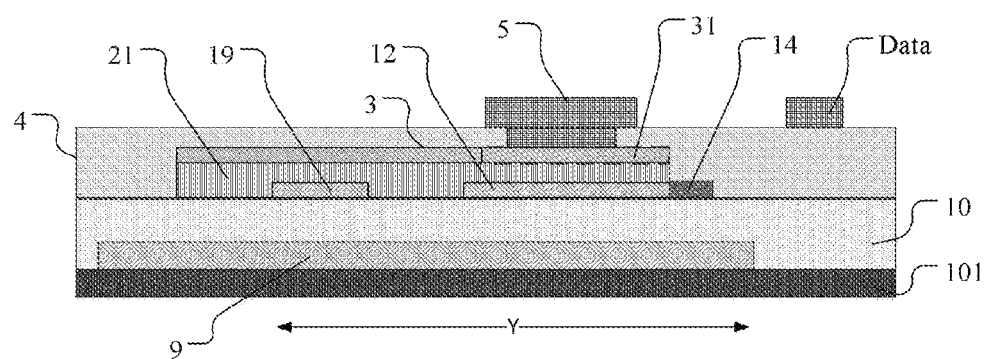
FIG. 5 is a cross-sectional view along a dashed line 02 in FIG. 3.

Based on this, the exemplary embodiment provides an array substrate. FIG. 3 is a schematic structural diagram of an exemplary embodiment of an array substrate of the present disclosure, FIGS. 3a-3g are top views of each layer of FIG. 3, FIG. 4 is a cross-sectional view along a dashed line 01 in FIG. 3, and FIG. 5 is a cross-sectional view along a dashed line 02 in FIG. 3. As shown in FIGS. 3, 3a-3g, 4, and 5, the array substrate further includes: a substrate 101, a conductive layer 1, a first gate insulating layer 21, a first gate layer 3 (including an extension portion 31), a dielectric layer 4, and a first source/drain layer 5. The substrate 101 includes a first transistor T1 including a first electrode and a first electrode contact area and a second transistor T2 including a gate disposed thereon, and the first electrode of the first transistor T1 is electrically connected to the gate of the second transistor T2; the conductive layer 1 is disposed on the substrate 101, and includes a first conductor portion 11, a first semiconductor portion 12, and a second conductor portion 13 that are sequentially connected along a first direction X; the second conductor portion 13 forms a first electrode contact area of the first transistor T1; the first gate insulating layer 21 is disposed on a side of the conductive layer 1 away from the substrate 101, and an orthographic projection of the first gate insulating layer 21 on the substrate 101 and an orthographic projection of the first semiconductor portion 12 on the substrate 101 overlap at an edge in the first direction X; the first gate layer 3 is disposed on a side of the first gate insulating layer 21 away from the substrate 101 to form the gate of the second transistor T2, and an orthographic projection of the first gate layer 3 on the substrate 101 and the orthographic projection of the first semiconductor portion 12 on the substrate 101 overlap at the edge in the first direction X; the dielectric layer 4 is disposed on the substrate 101 to cover a part of the first conductor portion 11, a part of the second conductor portion 13, and a part of the first gate layer 3, and the dielectric layer 4 is provided with a first via hole 41, an orthographic projection of the first via hole 41 on the substrate 101 overlaps with orthographic projections of at least a part of the first conductor portion 11, at least a part of the second conductor portion 13, and the first gate layer 3 on the substrate 101; the first source/drain layer 5 is disposed on a side of the dielectric layer 4 away from the substrate 101, and is electrically connected to the first conductor portion 11, the first gate layer 3, and the second conductor portion 13, and an orthographic projection of the first source/drain layer 5 on the substrate 101 at least partially overlaps with the orthographic projection of the first via hole 41 on the substrate 101, and the first source/drain layer forms the first electrode of the first transistor; the first conductor portion, the second conductor portion, and the first gate layer are all electrically connected to the first source/drain layer in the first via hole. As shown in FIGS. 3 and 4, the array substrate may further include a data signal line Data electrically connected to the second electrode of the first transistor T1. The array substrate further includes a storage capacitor C. A diagram of a pixel driving circuit of the array substrate can be as shown in FIG. 1. The first transistor T1 in FIGS. 3 and 4 can form the first transistor T1 in FIG. 1; the second transistor T2 in FIGS. 3 and 4 can form the second transistor T2 in FIG. 1; an electrode of the storage capacitor C in FIGS. 3 and 4 can be formed by the first conductor portion 11, and the storage capacitor C can form the storage capacitor C in FIG. 1; the third transistor T3 in FIGS. 3 and 4 may form the third transistor T3 in FIG. 1; the data signal line Data in FIG. 3 may provide the data signal terminal Data in FIG. 1.

The present disclosure provides an array substrate. On the one hand, the array substrate provided by the present disclosure connects the first gate layer 3, the first conductor portion 11, and the second conductor portion 13 through the first via hole 41, which reduces the number of via holes, and thus increases the arrangement area of the first conductor portion 11 so as to increase the capacitance value of the storage capacitor formed by the first conductor portion 11; on the other hand, in the array substrate provided by the present disclosure, a current output by the first transistor T1 can charge the first conductor portion 11 through the first semiconductor portion 12. In addition, the current output by the first transistor T1 can charge the first conductor portion 11 through the second conductor portion 13 and the first source/drain layer 5, thereby increasing the charging speed of the storage capacitor formed by the first conductor portion 11.

In this exemplary embodiment, as shown in FIGS. 3, 3a-3g, 4, and 5, the active layer of the third transistor T3 is denoted as 18; the active layer of the second transistor T2 is denoted as 19; the gate insulating layer of the third transistor T3 is denoted as 23; the gate insulating layer of the first transistor T1 is denoted as 22; the gate of the third transistor is denoted as 102.

In this exemplary embodiment, as shown in FIGS. 3, 3a-3g, 4, and 5, the first electrode of the first transistor T1 may be electrically connected to the first capacitor electrode of the storage capacitor C and the gate of the second transistor T2, and the first electrode of the second transistor T2 may be electrically connected to the second capacitor electrode of the storage capacitor C. The first conductor portion 11 may form the first capacitor electrode. The first capacitor electrode may correspond to the capacitor electrode ACT in FIG. 1.

In this exemplary embodiment, as shown in FIGS. 3, 3a-3g, 4, and 5, the array substrate may further include a second source/drain layer 8, and the second source/drain layer 8 may be disposed in a same layer as the first source/drain layer 5 to form the source/drain of the second transistor T2. The second source/drain layer 8 may include a first sub-source/drain layer 81. An orthographic projection of the first sub-source/drain layer 81 on the substrate 101 partially overlaps with the orthographic projection of the first conductor portion 11 on the substrate 101. The first sub-source/drain layer 81 may form the second capacitor electrode of the storage capacitor C, and the second capacitor electrode may correspond to the capacitor electrode SD in FIG. 1, so that the first sub-source/drain layer 81 and the first conductor portion 11 form a capacitor structure.

In this exemplary embodiment, as shown in FIGS. 3, 3a-3g, 4, and 5, the array substrate may further include a light-shielding metal layer 9 and a buffer layer 10. The light-shielding metal layer 9 is disposed on the substrate 101 and includes a first light-shielding metal portion 91; the buffer layer 10 is formed on the substrate 101 and covers the light-shielding metal layer 9. The conductive layer 1 is formed on a side of the buffer layer 10 away from the substrate 101. An orthographic projection of the first light-shielding metal portion 91 on the substrate 101 at least partially overlaps with the orthographic projection of the first conductor portion 11 on the substrate. The first light-shielding metal portion 91 forms a third capacitor electrode of the storage capacitor, and the third capacitor electrode may correspond to the capacitor electrode SHL in FIG. 1, so that the first light-shielding metal portion 91 and the first conductor portion form another capacitor structure. The light-shielding metal layer 9 can also be used for shielding the channel area of the second transistor T2 to prevent light from irradiating the channel area to change the conductivity of the channel area.

In this exemplary embodiment, as shown in FIGS. 3, 3a-3g, 4, and 5, the second source/drain layer 8 may further include a second sub-source/drain layer 82, and the light-shielding metal layer 9 may also include a second light-shielding metal portion 92. An orthographic projection of the second sub-source/drain layer 82 on a plane where the first conductor portion 11 is located is outside the first conductor portion 11, and an orthographic projection of the second light-shielding metal portion 92 on the second source/drain layer overlaps with the second sub-source/drain layer 82. The second sub-source/drain portion 82 and the second light-shielding metal portion 92 may be electrically connected through the second via hole 42 penetrating the dielectric layer 4 and the buffer layer 10. This arrangement makes the above two capacitor structures form parallel capacitors, so that the capacitance value of the storage capacitor C can be increased.

Figure 3C:
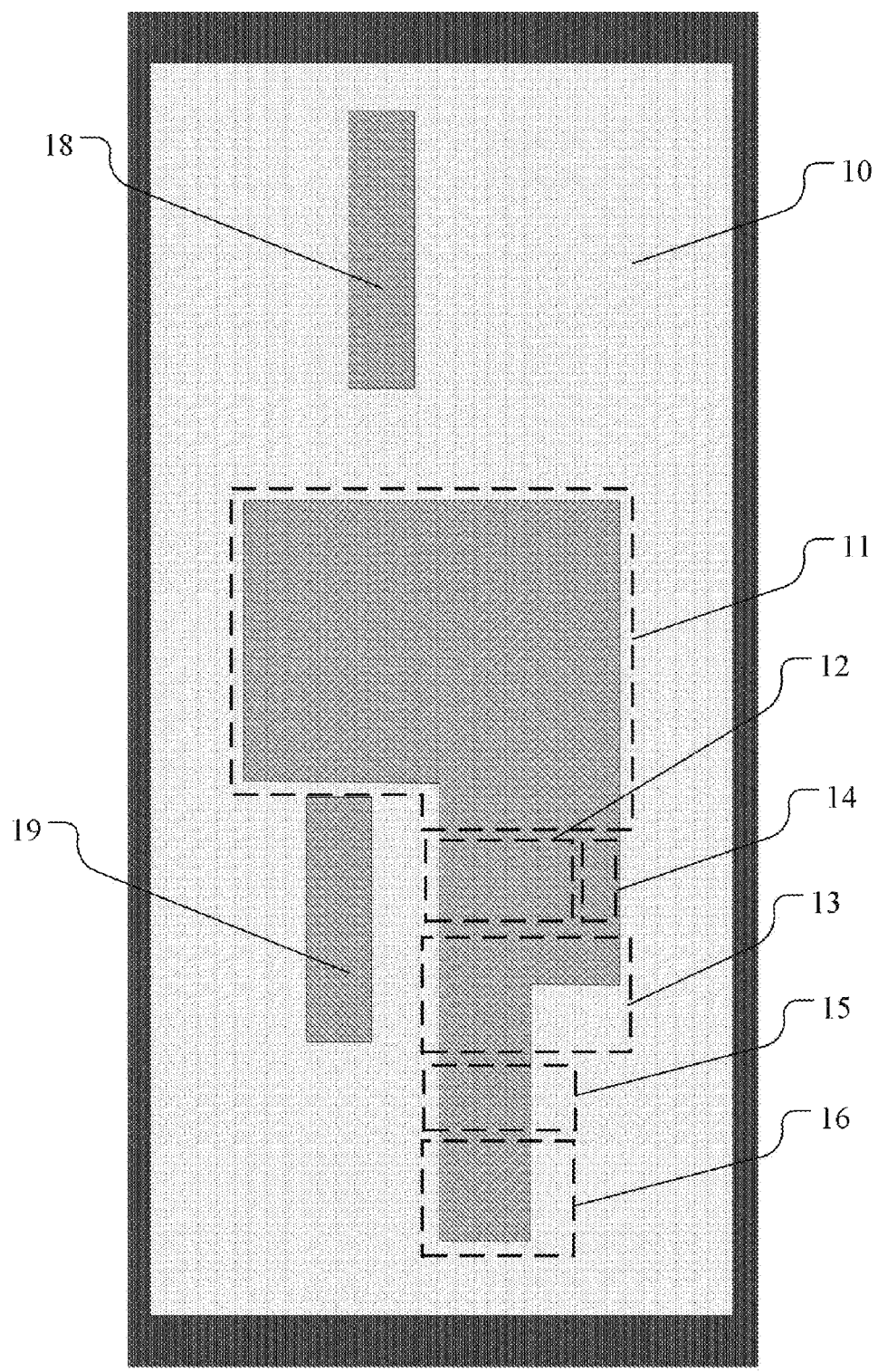
Figure 3D:
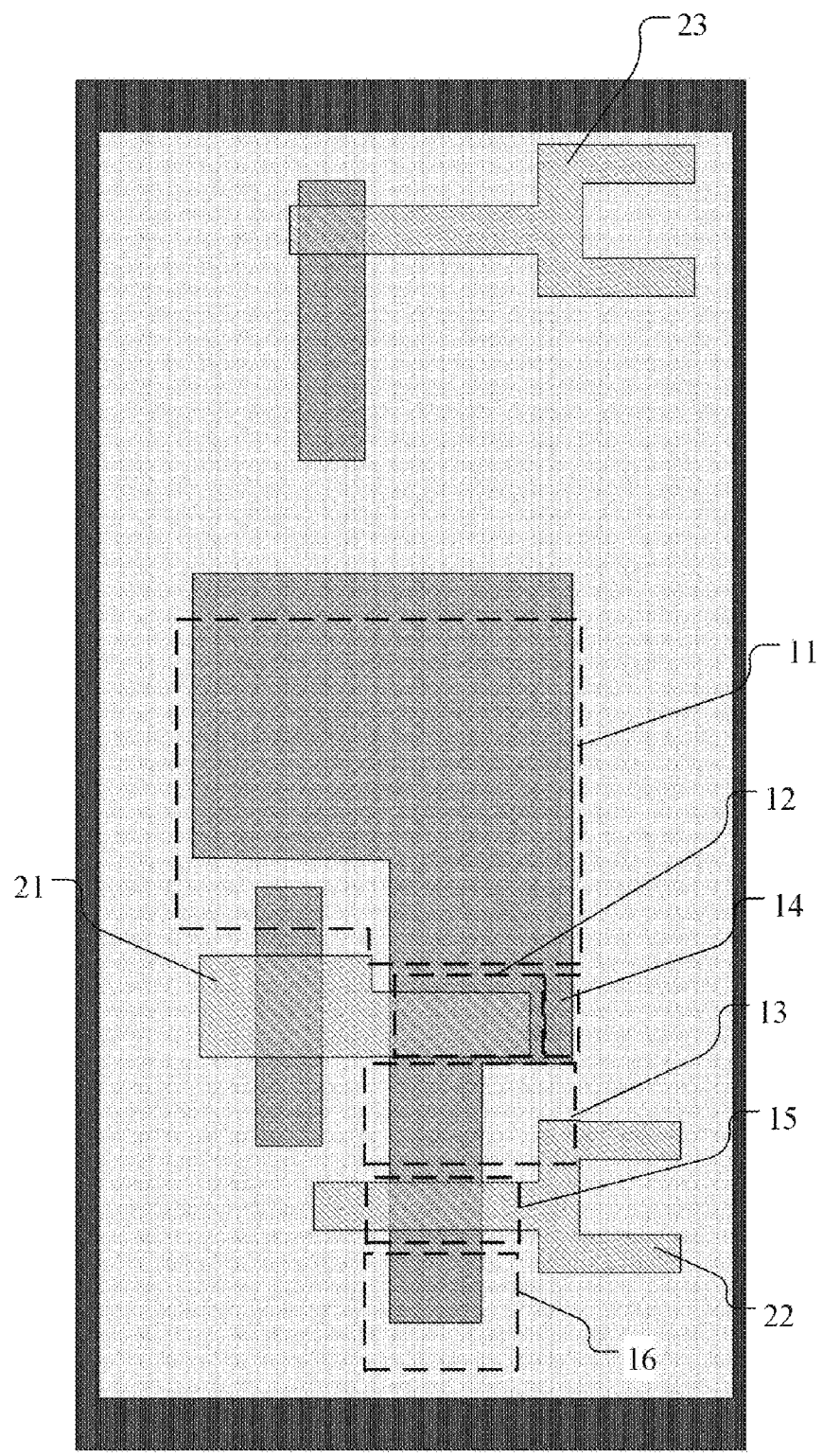

In this exemplary embodiment, as shown in FIGS. 3, 3c, and 5, the conductive layer may further include a fourth conductor portion 14 connected between the first conductor portion 11 and the second conductor portion 13. The fourth conductor portion 14 is located in an area not covered by the gate layer 3 between the first conductor portion 11 and the second conductor portion 13. The first conductor portion 11 and the second conductor portion 13 can also transmit current through the fourth conductor portion 14.

In this exemplary embodiment, as shown in FIGS. 3c and 4, the conductive layer 1 may further include a second semiconductor portion 15 and a third conductor portion 16. The second semiconductor portion 15 forms a channel area of the first transistor, and the first conductor portion 11, the first semiconductor portion 12, the second conductor portion 13, the second semiconductor portion 15, and the third conductor portion 16 are sequentially connected along the first direction X. The array substrate also includes: a second gate insulating layer 22 and a second gate layer 6. The second gate insulating layer 22 is disposed on a side of the second semiconductor portion 15 away from the substrate 101; the second gate layer 6 is disposed on a side of the second gate insulating layer 15 away from the substrate 101 to form the gate of the first transistor; the source/drain 7 of the first transistor is coupled to the third conductor portion 16 through a via hole 43. The third conductor portion 16 may form the second electrode of the first transistor T1. An orthographic projection of the second gate insulating layer 22 on the substrate 101 and an orthographic projection of the second gate layer 6 on the substrate 101 may overlap at the edge in the first direction X. The first semiconductor portion can be selected as indium gallium zinc oxide, the first conductor and the second conductor can be selected as hydrogen ionized indium gallium zinc oxide; the buffer layer can be selected as inorganic materials such as SiOx, and the dielectric layer can be selected as $TiO_2$, $Ta_2O_5$, $HfO_2$ and other materials; the light-shielding metal layer can be selected as copper, aluminum and other metals; and the substrate can be selected as the glass substrate.

In this exemplary embodiment, as shown in FIGS. 1, 3, and 4, the first electrode of the first transistor T1 is electrically connected to the first capacitor electrode ACT of the storage capacitor C and the gate of the second transistor T2. The second electrode of the first transistor T1 is configured to receive a data signal provided by the data signal line Data, the gate of the first transistor T1 is configured to receive a first control signal provided by a first control signal line, and the first transistor T1 is configured to write the data signal into the gate of the second transistor T2 and the storage capacitor C in response to the first control signal; the first electrode of the second transistor T2 is electrically connected to the second capacitor electrode of the storage capacitor C, and is configured to be electrically connected to a light emitting element OLED; the second electrode of the second transistor T2 is configured to receive a first power voltage provided by a first power voltage signal, and the second transistor T2 is configured to control a current for driving the light emitting element OLED under control of a voltage of the gate of the second transistor.

Figure 6:
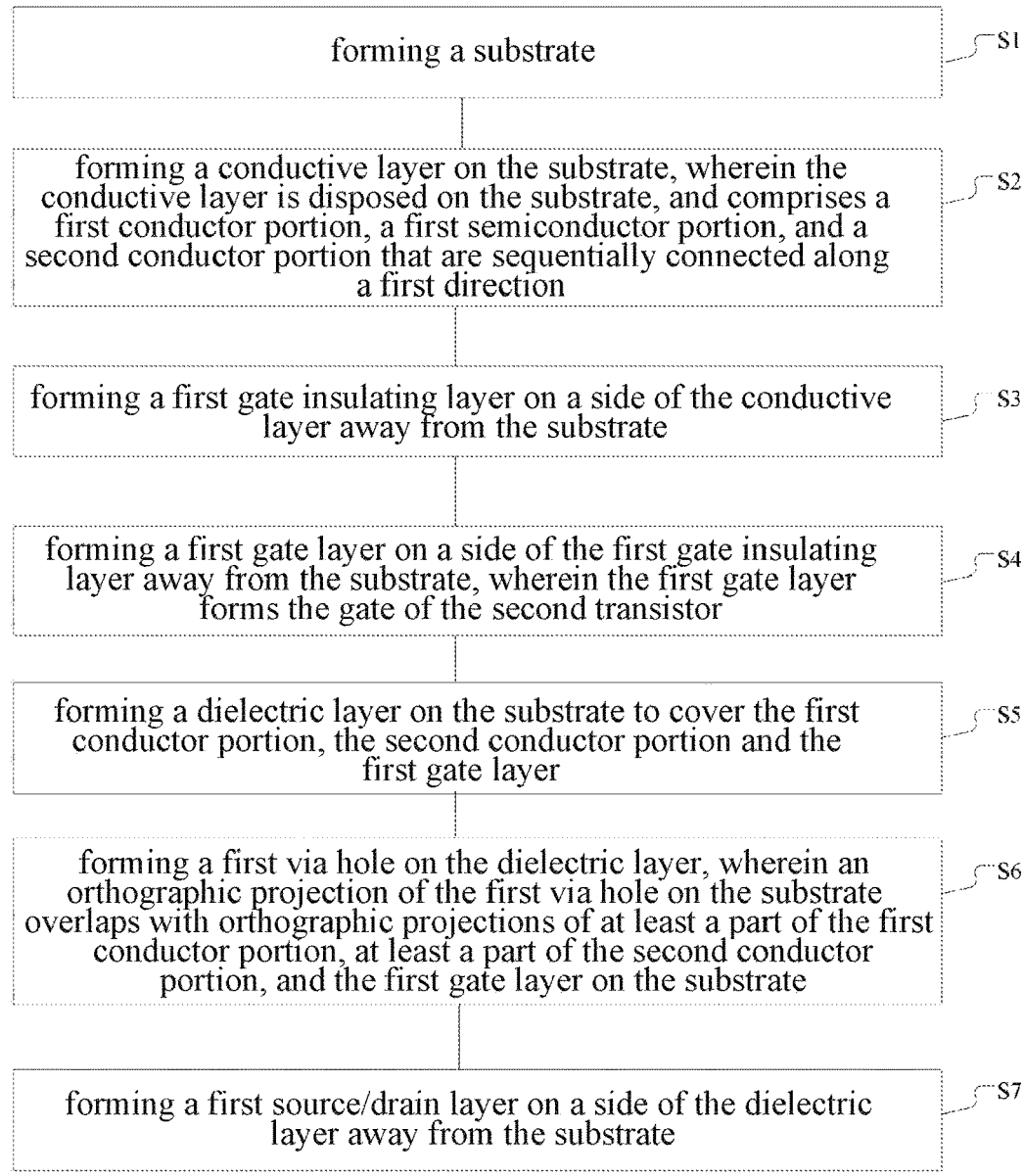
FIG. 6 is a flowchart of at least one exemplary embodiment of a manufacturing method for an array substrate of the present disclosure.

This exemplary embodiment also provides a manufacturing method for an array substrate. FIG. 6 is a flowchart of an exemplary embodiment of a manufacturing method for an array substrate of the present disclosure, and as shown in FIG. 6, the method includes following steps.

In step S1, a substrate is formed. The substrate includes a first transistor including a first electrode and a first electrode contact area, and a second transistor including a gate disposed thereon, and the first electrode of the first transistor is electrically connected to the gate of the second transistor.

In step S2, a conductive layer is formed on the substrate; the conductive layer is disposed on the substrate, and includes a first conductor portion, a first semiconductor portion, and a second conductor portion that are sequentially connected along a first direction; the second conductor portion forms a first electrode contact area of the first transistor.

In step S3, a first gate insulating layer is formed on a side of the conductive layer away from the substrate; an orthographic projection of the first gate insulating layer on the substrate and an orthographic projection of the first semiconductor portion on the substrate overlap at an edge in the first direction.

In step S4, a first gate layer is formed on a side of the first gate insulating layer away from the substrate; the first gate layer forms the gate of the second transistor, and an orthographic projection of the first gate layer on the substrate and the orthographic projection of the first semiconductor portion on the substrate overlap at the edge in the first direction.

In step S5, a dielectric layer is formed on the substrate to cover the first conductor portion, the second conductor portion and the first gate layer.

In step S6, a first via hole is formed on the dielectric layer; an orthographic projection of the first via hole on the substrate overlaps with orthographic projections of at least a part of the first conductor portion, at least a part of the second conductor portion and the first gate layer on the substrate.

In step S7, a first source/drain layer is formed on a side of the dielectric layer away from the substrate; the first source/drain layer is electrically connected to the first conductor portion, the first gate layer and the second conductor portion, and an orthographic projection of the first source/drain layer on the substrate at least partially overlaps with the orthographic projection of the first via hole on the substrate.

The above steps are described in detail below.

FIGS. 7-12 are schematic structural diagrams of an exemplary embodiment of a manufacturing method for an array substrate of the present disclosure. As shown in FIGS. 7-12, in the step S1, a substrate 101 is formed; in the step S2, a semiconductor layer is formed; the semiconductor layer includes a first semiconductor portion 011, a second semiconductor portion 012, and a third semiconductor portion 013 sequentially distributed along the first direction X.

Figure 8:
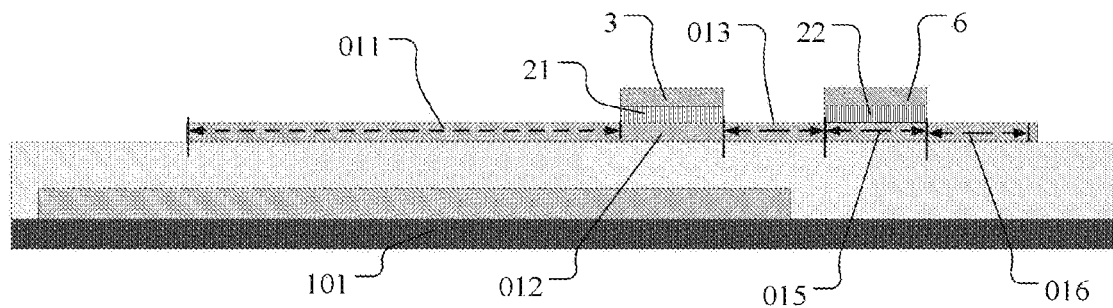

As shown in FIG. 8, in the step S3, a first gate insulating layer 21 is formed on a side of the second semiconductor portion 012 away from the substrate 101; a first gate layer 3 is formed on a side of the first gate insulating layer 21 away from the substrate. The first gate layer 3 forms the gate of the second transistor.

Figure 9:
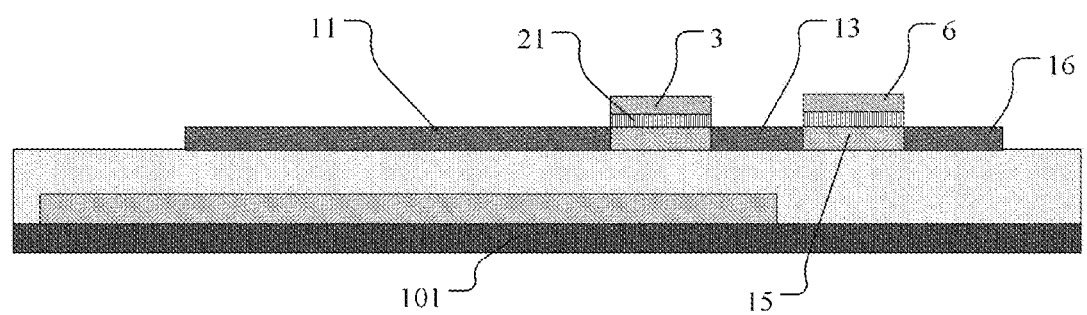

As shown in FIG. 9, in the step S4, conduction treatment is performed on the semiconductor layer 1, so that the first semiconductor portion 011 forms the first conductor portion 11, and the third semiconductor portion 013 forms the second conductor portion 13. The second conductor portion 13 at least partially forms the first electrode contact area of the first transistor; the semiconductor layer may include indium gallium zinc oxide, and the step of performing conduction treatment on the semiconductor layer may include: performing hydrogen ion implantation on a side of the semiconductor layer away from the substrate.

Figure 10:
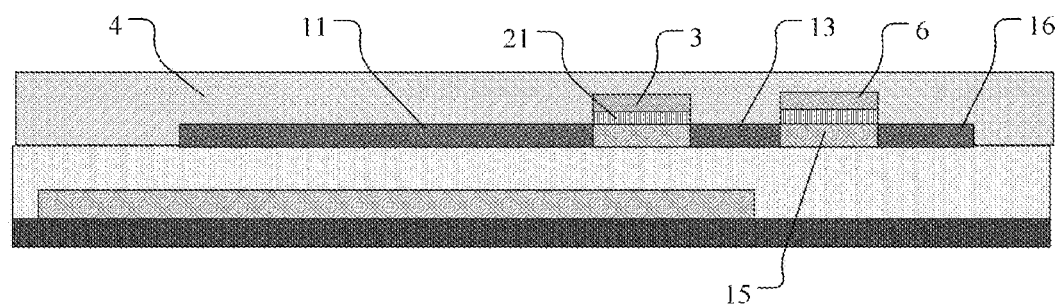

As shown in FIG. 10, in the step S5, a dielectric layer 4 is formed on the substrate to cover the first conductor portion 11, the second conductor portion 13 and the first gate layer 3.

Figure 11:
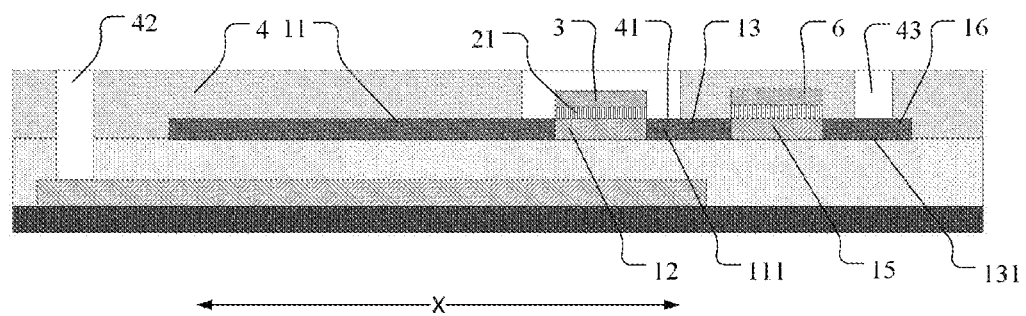

As shown in FIG. 11, in the step S6, a first via hole 41 is formed on the dielectric layer, an orthographic projection of the first via hole 41 on the substrate and orthographic projections of at least part of the first conductor portion 11, at least part of the second conductor portion 13 and the first gate layer 3 on the substrate overlap at the edge in the first direction X.

Figure 12:
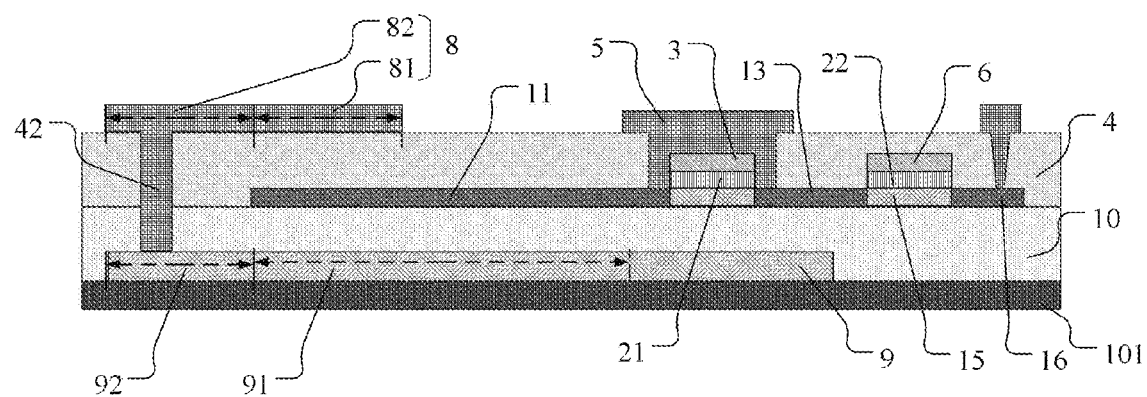

As shown in FIG. 12, in the step S7, a first source/drain layer 5 is formed on a side of the dielectric layer 4 away from the semiconductor layer, the first source/drain layer 5 is electrically connected to the first conductor portion 11, the first gate layer 3 and the second conductor portion 13. An orthographic projection of the first source/drain layer 5 on the substrate 101 at least partially overlaps with the orthographic projection of the first via hole 41 on the substrate 101.

In this exemplary embodiment, the array substrate further includes a storage capacitor, and the first conductor portion forms the first capacitor electrode. As shown in FIG. 12, the step of forming the first source/drain layer 5 on the side of the dielectric layer away from the semiconductor layer to form the source/drain of the first transistor may also include: forming a second source/drain layer 8 to form the second capacitor electrode of the storage capacitor.

The second source/drain layer 8 may include a first sub-source/drain layer 81. An orthographic projection of the first sub-source/drain layer 81 on the substrate 101 partially overlaps with the orthographic projection of the first conductor portion 11 on the substrate 101. The first sub-source/drain layer 81 may form the second capacitor electrode of the storage capacitor C. The second capacitor electrode may correspond to the capacitor electrode SD in FIG. 1, so that the first sub-source/drain layer 81 and the first conductor portion 11 form a capacitor structure. The second source/drain layer 8 may be formed with the first source/drain layer by one patterning process.

In this exemplary embodiment, the manufacturing method for the array substrate may further include:

a light-shielding metal layer 9 is formed on the substrate 101, and the light-shielding metal layer 9 includes a first light-shielding metal portion 91. An orthographic projection of the first light-shielding metal portion 91 on the substrate 101 at least partially overlaps with the orthographic projection of the first conductor portion 11 on the substrate. The first light-shielding metal portion 91 forms a third capacitor electrode of the storage capacitor, and the third capacitor electrode may correspond to the capacitor electrode SHL in FIG. 1, so that the first light-shielding metal portion 91 and the first conductor portion form another capacitor structure.

A buffer layer 10 is formed on a side of the light-shielding metal layer 9 away from the substrate 101. The semiconductor layer is formed on a side of the buffer layer away from the first light-shielding metal portion.

In this exemplary embodiment, the second source/drain layer 8 may further include a second sub-source/drain layer 82, and the light-shielding metal layer 9 may also include a second light-shielding metal portion 92. An orthographic projection of the second sub-source/drain layer 82 on a plane where the first conductor portion 11 is located is outside the first conductor portion 11, and an orthographic projection of the second light-shielding metal portion 92 on the second source/drain layer overlaps with the second sub-source/drain layer 82. The second sub-source/drain portion 82 and the second light-shielding metal portion 92 may be electrically connected through the second via hole 42 penetrating the dielectric layer 4 and the buffer layer 10. This arrangement makes the above two capacitor structures form parallel capacitors, so that the capacitance value of the storage capacitor C can be increased.

The dielectric layer 4 also covers a side of the buffer layer 10 away from the substrate 101.

Before forming the second source/drain layer, the method may further include:

a second via hole 42 is formed in the dielectric layer 4 and the buffer layer 10. After the second source/drain layer is formed, the second source/drain layer covers the second via hole 42, so that the second source/drain layer is electrically connected to the light-shielding metal layer 9. This arrangement can make the first capacitor structure and the second capacitor structure form parallel capacitors, thereby increasing the capacitance value of the capacitor.

In this exemplary embodiment, the semiconductor layer may further include a fourth semiconductor portion connected between the first semiconductor portion and the second semiconductor portion, and the step of performing conduction treatment on the semiconductor layer may also include:

conduction treatment is performed on the fourth semiconductor portion. The fourth semiconductor portion may be located at the position where the third conductor portion 14 is located in FIG. 3.

Figure 7:
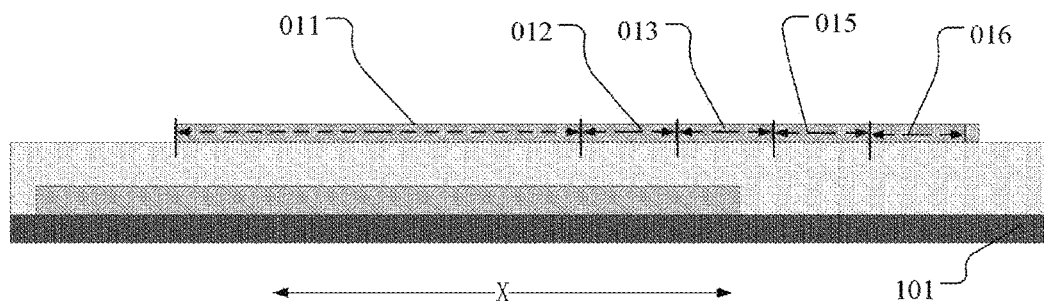
FIGS. 7-12 are schematic structural diagrams of at least one exemplary embodiment of a manufacturing method for an array substrate of the present disclosure.

In this exemplary embodiment, as shown in FIG. 7, the semiconductor layer further includes a fifth semiconductor portion 015 and a sixth semiconductor portion 016, the first semiconductor portion 011, the second semiconductor portion 012, and the third semiconductor portion 013, the fifth semiconductor portion 015 and the sixth semiconductor portion 016 are sequentially connected along the first direction, and the manufacturing method for the array substrate further includes:

as shown in FIG. 8, while the first gate insulating layer is formed on the side of the second semiconductor portion away from the substrate, a second gate insulating layer 22 is formed on a side of the fifth semiconductor portion 015 away from the substrate.

While the first gate layer is formed on the side of the first gate insulating layer away from the substrate, a second gate layer 6 is formed on the side of the second gate insulating layer away from the substrate. The second gate layer forms the gate of the first transistor.

As shown in FIG. 9, the step of performing conduction treatment on the semiconductor layer also includes: the conduction treatment is performed on the sixth semiconductor portion 016, so that the sixth semiconductor portion 016 forms the third conductor portion 16, and the fifth semiconductor portion 015 forms the channel area (the second semiconductor portion 15) of the first transistor.

Figure 13:
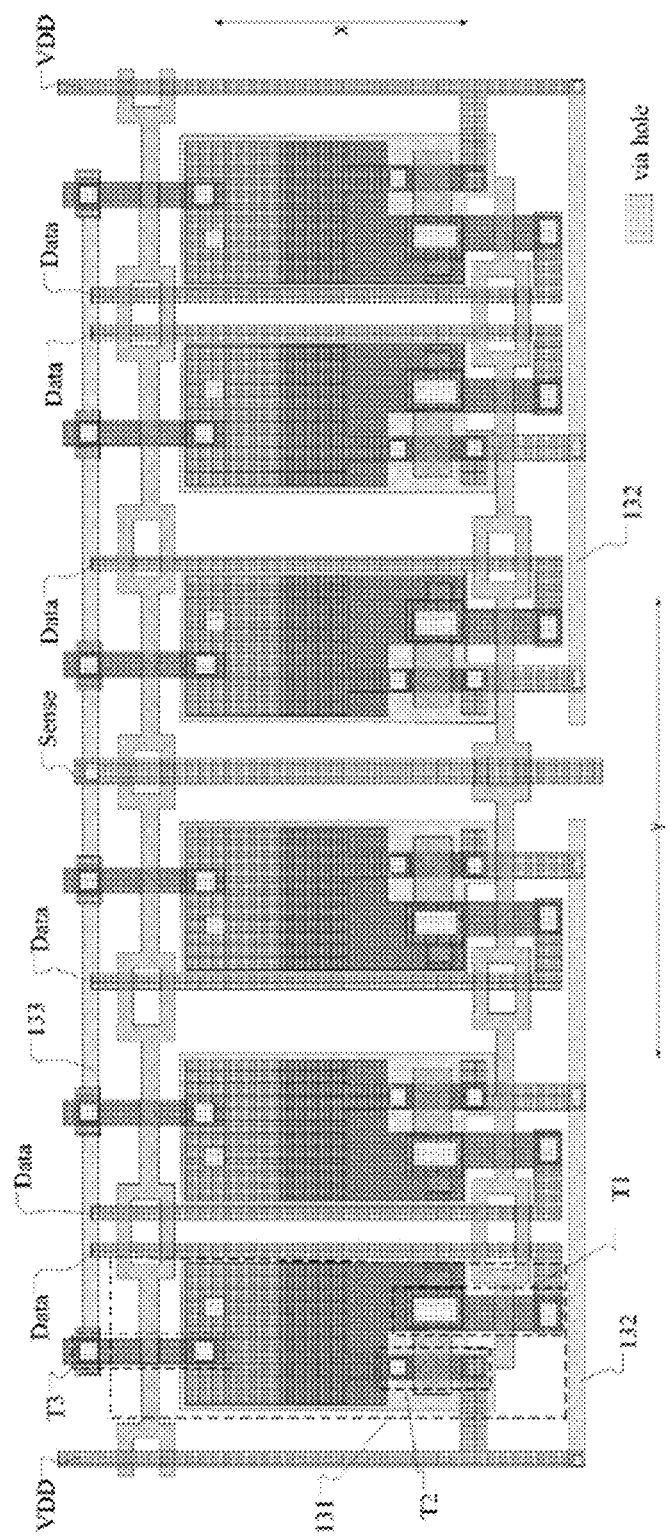
FIG. 13 is a schematic structural diagram of at least one exemplary embodiment of an array substrate of the present disclosure.

FIG. 13 is a schematic structural diagram of another exemplary embodiment of an array substrate of the present disclosure. The array substrate includes a substrate and a plurality of sub-pixels 131 located on the substrate. The plurality of sub-pixels 131 are arranged as a sub-pixel array, and the sub-pixel array is distributed along a first direction X and a second direction Y, and the first direction X intersects with the second direction Y. This exemplary embodiment only exemplarily provides a part of the sub-pixels 131, a part of the data lines Vdata and the power supply lines VDD extending in the first direction, and a part of the sensing lines Sens extending in the first direction. In the array substrate, the data line Data can be coupled to its adjacent pixel units. The power line VDD can be coupled to its adjacent pixel units. In addition, the power line VDD can also be coupled to the non-adjacent pixel units through the lead 132. The sensing line Sense may be coupled to the adjacent pixel units through the lead 133. The data line Data can be coupled to the source/drain of the first transistor T1 in the array substrate through the via hole; the power line VDD can be directly coupled to the source/drain of the second transistor T2 in the array substrate or through the lead 132; the sensing line Sense may be coupled to the source/drain of the third transistor T3 in the array substrate through the lead 133. In this exemplary embodiment, the leads 132 and 113 may be arranged in the same layer as the light-shielding metal layer in the array substrate, that is, formed by one patterning process.

Figure 3E:
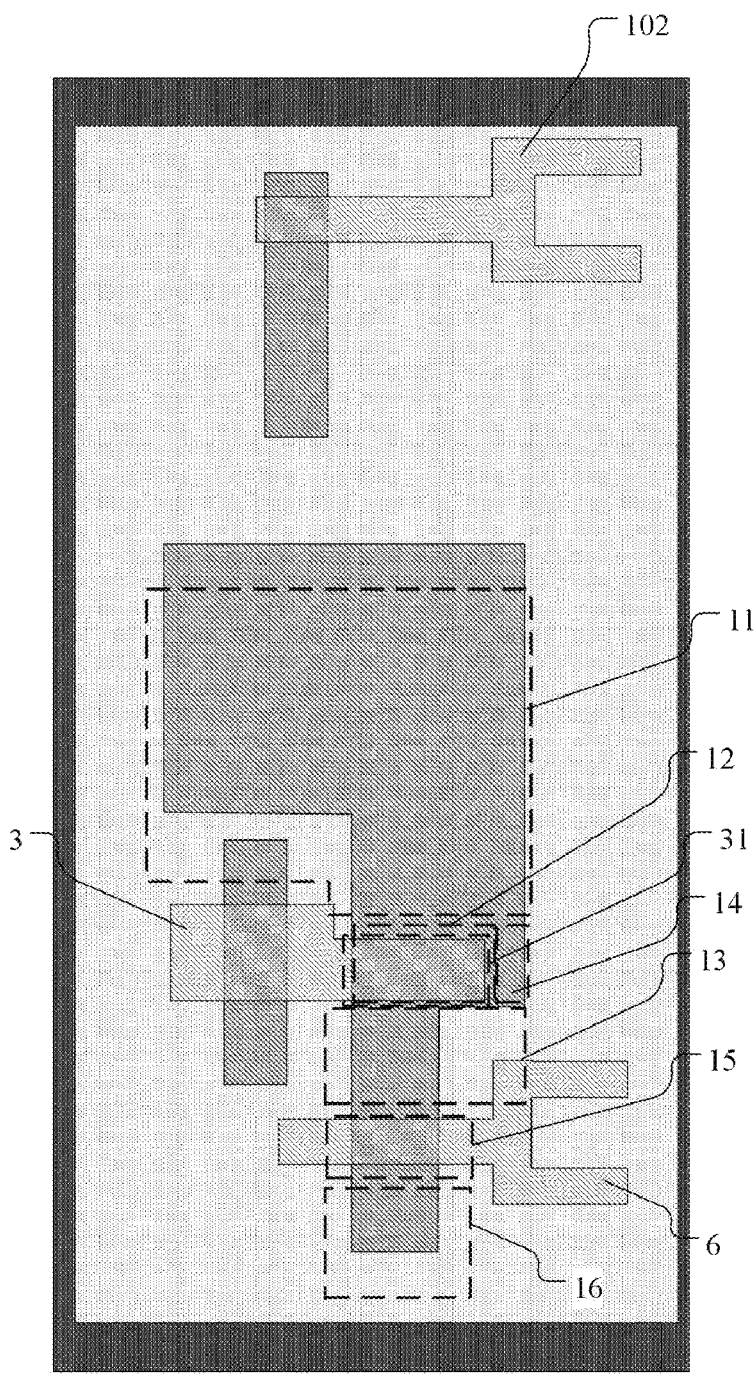
Figure 3F:
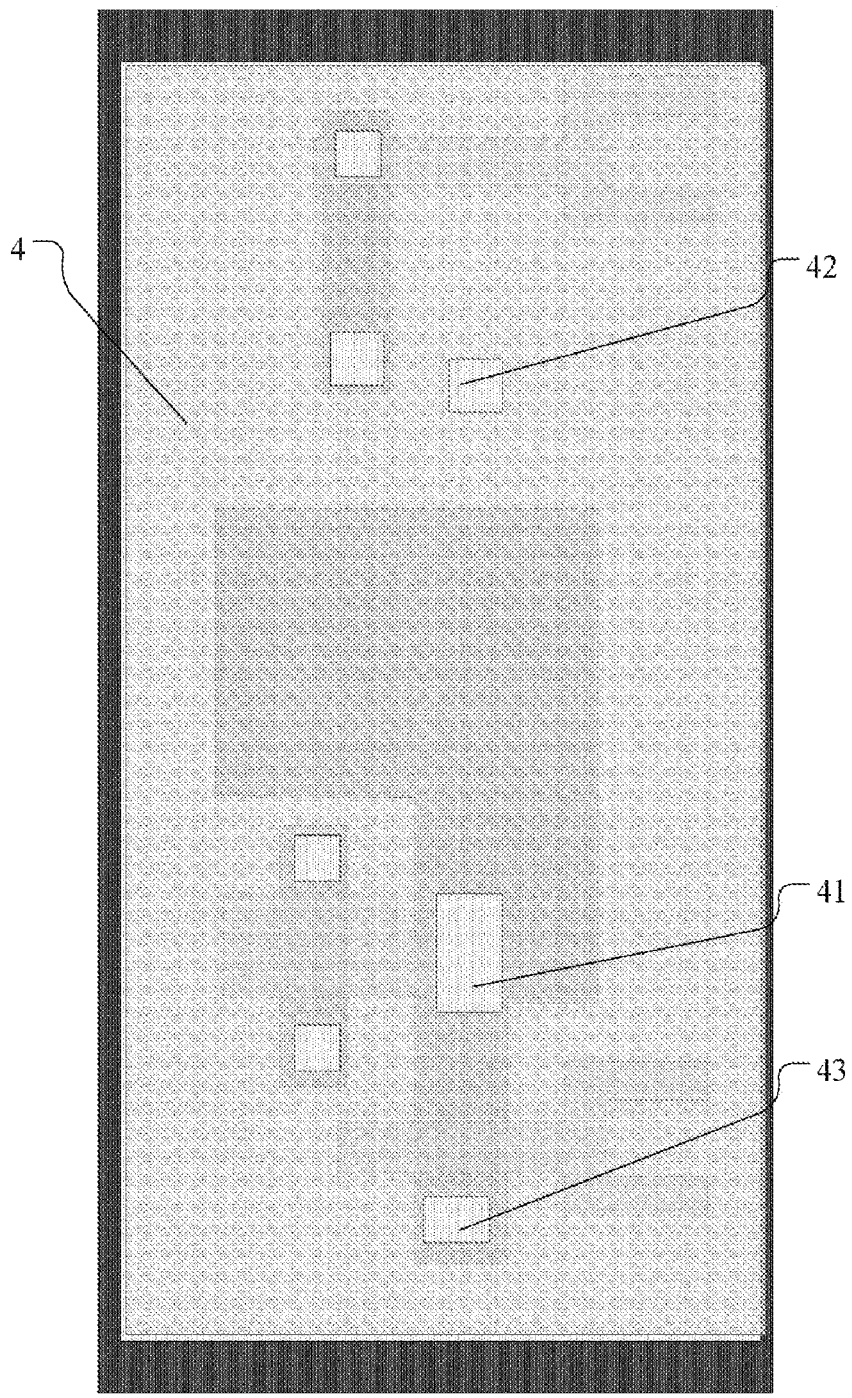
Figure 3G:
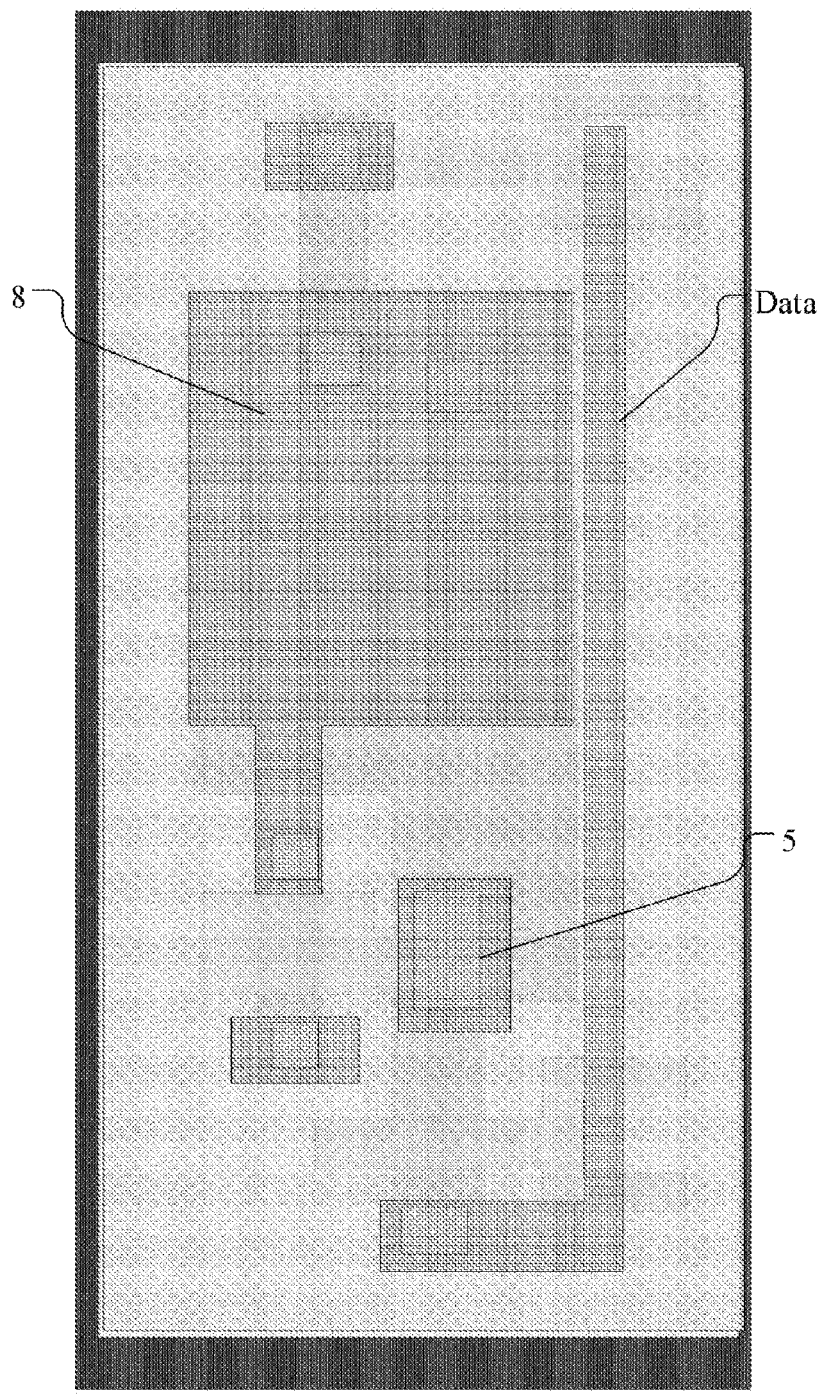

In this exemplary embodiment, the specific structure of the sub-pixel 131 may be as shown in FIG. 3, the circuit diagram of the sub-pixel 131 may be as shown in FIG. 1, and a top view of each layer of the sub-pixel may be as shown in FIGS. 3a-3g, a cross-sectional view along dashed line 01 in FIG. 3 is shown in FIG. 4, and a cross-sectional view along dashed line 02 in FIG. 3 is shown in FIG. 5. FIGS. 7-12 are schematic structural diagrams of manufacturing the sub-pixel. At least one of the sub-pixels includes a second transistor T2, a first transistor T1, and a storage capacitor C on the substrate 101; a first electrode 5 of the first transistor T1 is electrically connected to a first capacitor electrode 11 of the storage capacitor C and a gate 3 of the second transistor T2; a second electrode 7 of the first transistor T1 is configured to receive a data signal (provided by the data signal line Data), a gate 22 of the first transistor T1 is configured to receive a first control signal (provided by the control signal terminal G1 in FIG. 1), and the first transistor T1 is configured to write the data signal into the gate 3 of the second transistor T2 and the storage capacitor C in response to the first control signal; a first electrode of the second transistor T2 is electrically connected to a second capacitor electrode 81 of the storage capacitor C (the second source/drain layer 8 may partially form the first electrode of the second transistor T2 and partially form the second capacitor electrode 81), and is configured to be electrically connected to a light emitting element which may be the OLED in FIG. 1; a second electrode of the second transistor T2 is configured to receive a first power voltage (which may be provided by the power line VDD in FIG. 13), and the second transistor T2 is configured to control a current for driving the light emitting element under control of a voltage of the gate 6 of the second transistor T2; the second capacitor electrode 81 and the first electrode of the first transistor T1 are insulated in a same layer and have a same material, as shown in FIG. 3e; the gate 3 of the second transistor T2 includes an extension portion 31 protruding in a second direction Y, and the extension portion 31 and the first electrode 5 of the first transistor T1 at least partially overlap in a direction perpendicular to the substrate and are electrically connected; as shown in FIG. 11, an active layer of the first transistor T1 includes a first electrode contact area 111 (a part of the second conductor 13), a second electrode contact area 131 (a part of the third conductor portion 16), and a channel area (a part of the second conductor portion 15) between the first electrode contact area and the second electrode contact area; the first electrode 5 of the first transistor T1 is electrically connected to the first electrode contact area, the extension portion, and the first capacitor electrode 11 by a first via hole 41, respectively.

In this exemplary embodiment, as shown in FIG. 11, the first via hole 41 may extend along the first direction X and exposes a surface of the extension portion 31 and at least part of two opposite sides in the first direction X.

In this exemplary embodiment, the two sides of the extension portion 31 are coated with the first electrode 5 of the first transistor T1 through the first via hole 41.

In this exemplary embodiment, the array substrate further includes a third transistor T3, and a first electrode of the third transistor is coupled to the first electrode of the second transistor, a second electrode of the third transistor is coupled to a sensing signal terminal, and a gate of the third transistor is used for connecting the sensing signal terminal and the first electrode of the second transistor under action of a second control signal.

In this exemplary embodiment, the storage capacitor further includes a third capacitor electrode 91 which is short-circuited with the second capacitor electrode 81.

The exemplary embodiment also provides a display panel including the above-mentioned array substrate.

The display panel has the same technical features and working principles as the above-mentioned array substrate, which have been described in detail above, and will not be repeated here. The display panel can be used in electronic devices such as mobile phones, tablet computers, and electronic paper.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. An array substrate, comprising:
    a substrate comprising a first transistor comprising a first electrode and a first electrode contact area and a second transistor comprising a gate disposed thereon, wherein the first electrode of the first transistor is electrically connected to the gate of the second transistor;
    a conductive layer disposed on the substrate, and comprising a first conductor portion, a first semiconductor portion, and a second conductor portion that are sequentially connected along a first direction, wherein the second conductor portion forms the first electrode contact area of the first transistor;
    a first gate insulating layer disposed on a side of the conductive layer away from the substrate, wherein an orthographic projection of the first gate insulating layer on the substrate and an orthographic projection of the first semiconductor portion on the substrate overlap at an edge in the first direction;
    a first gate layer disposed on a side of the first gate insulating layer away from the substrate to form the gate of the second transistor, wherein an orthographic projection of the first gate layer on the substrate and the orthographic projection of the first semiconductor portion on the substrate overlap at the edge in the first direction;
    a dielectric layer disposed on the substrate to cover a part of the first conductor portion, a part of the second conductor portion and a part of the first gate layer, wherein the dielectric layer is provided with a first via hole, and an orthographic projection of the first via hole on the substrate overlaps with orthographic projections of at least a part of the first conductor portion, at least a part of the second conductor portion and the first gate layer on the substrate; and
    a first source/drain layer disposed on a side of the dielectric layer away from the substrate, and electrically connected to the first conductor portion, the first gate layer and the second conductor portion, wherein an orthographic projection of the first source/drain layer on the substrate at least partially overlaps with the orthographic projection of the first via hole on the substrate,
    wherein the first source/drain layer forms the first electrode of the first transistor; and
    wherein the first conductor portion, the second conductor portion, and the first gate layer are all electrically connected to the first source/drain layer in the first via hole.

2. The array substrate according to claim 1, wherein:
    the conductive layer further comprises a second semiconductor portion coupled to the second conductor portion along the first direction, and a third conductor portion, wherein the second semiconductor portion forms a channel area of the first transistor, the first conductor portion, the first semiconductor portion, the second conductor portion, the second semiconductor portion, and the third conductor portion are sequentially connected along the first direction, and the array substrate further comprises:
    a second gate insulating layer disposed on a side of the second semiconductor portion away from the substrate; and
    a second gate layer disposed on a side of the second gate insulating layer away from the substrate to form a gate of the first transistor.

3. The array substrate according to claim 2, wherein an orthographic projection of the second gate insulating layer on the substrate and an orthographic projection of the second gate layer on the substrate overlap at the edge in the first direction.

4. The array substrate according to claim 3, wherein the array substrate further comprises a data signal line electrically connected to a second electrode of the first transistor, wherein the third conductor portion forms the second electrode of the first transistor.

5. The array substrate according to claim 1, wherein:
    the array substrate further comprises a storage capacitor, and the first electrode of the first transistor is electrically connected to a first capacitor electrode of the storage capacitor and the gate of the second transistor, a first electrode of the second transistor is electrically connected to a second capacitor electrode of the storage capacitor; and
    the first conductor portion forms the first capacitor electrode.

6. The array substrate according to claim 5, wherein the array substrate further comprises:
    a second source/drain layer disposed in a same layer as the first source/drain layer to form the second capacitor electrode of the storage capacitor;
    wherein an orthographic projection of the second source/drain layer on the substrate at least partially overlaps with an orthographic projection of the first conductor portion on the substrate.

7. The array substrate according to claim 6, wherein the array substrate further comprises:
    a light-shielding metal layer disposed on a side of the conductive layer facing the substrate;
    a buffer layer formed on a side of the light-shielding metal layer away from the substrate;
    wherein an orthographic projection of the light-shielding metal layer on the substrate at least partially overlaps with the orthographic projection of the first conductor portion on the substrate;

the light-shielding metal layer forms a third capacitor electrode of the storage capacitor.

8. The array substrate according to claim 7, wherein:
an orthographic projection of the second source/drain layer on a plane where the first conductor portion is located is at least partially located outside the first conductor portion;
an orthographic projection of the light-shielding metal layer on the plane where the first conductor portion is located is at least partially located outside the first conductor portion, and an orthographic projection of the light-shielding metal layer on the second source/drain layer at least partially overlaps with the second source/drain layer;
the second source/drain layer and the light-shielding metal layer are electrically connected by a second via hole that penetrates the dielectric layer and the buffer layer.

9. The array substrate of claim 8, wherein the second capacitor electrode of the storage capacitor formed by the second source/drain layer is electrically connected to the third capacitor electrode of the storage capacitor formed by the light-shielding metal layer.

10. The array substrate according to claim 1, wherein the conductive layer further comprises a fourth conductor portion connected between the first conductor portion and the second conductor portion.

11. The array substrate according to claim 1, wherein the array substrate further comprises a storage capacitor,
the first electrode of the first transistor is electrically connected to the first capacitor electrode of the storage capacitor and the gate of the second transistor; the second electrode of the first transistor is configured to receive a data signal provided by the data signal line, the gate of the first transistor is configured to receive a first control signal provided by a first control signal line, and the first transistor is configured to write the data signal into the gate of the second transistor and the storage capacitor in response to the first control signal;
the first electrode of the second transistor is electrically connected to the second capacitor electrode of the storage capacitor, and is configured to be electrically connected to a light emitting element, the second electrode of the second transistor is configured to receive a first power voltage provided by a first power voltage signal, and the second transistor is configured to control a current for driving the light emitting element under control of a voltage of the gate of the second transistor.

12. The array substrate of claim 1, wherein the first semiconductor portion comprises indium gallium zinc oxide, and the first conductor portion and the second conductor portion comprise hydrogen ionized indium gallium zinc oxide.

13. An array substrate, comprising: a substrate and a plurality of sub-pixels located on the substrate, wherein:
the plurality of sub-pixels are arranged in a sub-pixel array, and the sub-pixel array is arranged along a first direction and a second direction intersecting with the first direction;
at least one of the sub-pixels comprises a second transistor, a first transistor, and a storage capacitor on the substrate;
a first electrode of the first transistor is electrically connected to a first capacitor electrode of the storage capacitor and a gate of the second transistor; a second electrode of the first transistor is configured to receive a data signal, a gate of the first transistor is configured to receive a first control signal, and the first transistor is configured to write the data signal into the gate of the second transistor and the storage capacitor in response to the first control signal;
a first electrode of the second transistor is electrically connected to a second capacitor electrode of the storage capacitor, and is configured to be electrically connected to a light emitting element, a second electrode of the second transistor is configured to receive a first power voltage, and the second transistor is configured to control a current for driving the light emitting element under control of a voltage of the gate of the second transistor;
the second capacitor electrode and the first electrode of the first transistor are insulated in a same layer and having a same material;
the gate of the second transistor comprises an extension portion protruding in the second direction, and the extension portion and the first electrode of the first transistor at least partially overlap in a direction perpendicular to the substrate and are electrically connected; and
an active layer of the first transistor comprises a first electrode contact area, a second electrode contact area, and a channel area between the first electrode contact area and the second electrode contact area, and the first electrode of the first transistor is electrically connected to the first electrode contact area, the extension portion, and the first capacitor electrode by a first via hole, respectively.

14. The array substrate according to claim 13, wherein the first via hole extends along the first direction and exposes a surface of the extension portion and at least a part of two opposite sides of the extension portion in the first direction.

15. The array substrate according to claim 14, wherein: the two sides of the extension portion are coated with the first electrode of the first transistor through the first via hole.

16. The array substrate according to claim 13, wherein the array substrate further comprises a third transistor, a first electrode of the third transistor is coupled to the first electrode of the second transistor, a second electrode of the third transistor is coupled to a sensing signal terminal, and a gate of the third transistor is used for connecting the sensing signal terminal and the first electrode of the second transistor under action of a second control signal.

17. The array substrate according to claim 13, wherein the storage capacitor further comprises a third capacitor electrode which is short-circuited with the second capacitor electrode.

18. The array substrate according to claim 1, wherein the array substrate is implemented in a display panel.

19. A manufacturing method for an array substrate, comprising:
forming a substrate, wherein the substrate comprises a first transistor comprising a first electrode and a first electrode contact area and a second transistor comprising a gate disposed thereon, and the first electrode of the first transistor is electrically connected to the gate of the second transistor;
forming a conductive layer on the substrate, wherein the conductive layer is disposed on the substrate, and comprises a first conductor portion, a first semiconductor portion, and a second conductor portion that are sequentially connected along a first direction, wherein the second conductor portion forms a first electrode contact area of the first transistor;

forming a first gate insulating layer on a side of the conductive layer away from the substrate, wherein an orthographic projection of the first gate insulating layer on the substrate and an orthographic projection of the first semiconductor portion on the substrate overlap at an edge in the first direction;

forming a first gate layer on a side of the first gate insulating layer away from the substrate, wherein the first gate layer forms the gate of the second transistor, and an orthographic projection of the first gate layer on the substrate and the orthographic projection of the first semiconductor portion on the substrate overlap at the edge in the first direction;

forming a dielectric layer on the substrate to cover the first conductor portion, the second conductor portion and the first gate layer;

forming a first via hole on the dielectric layer, wherein an orthographic projection of the first via hole on the substrate overlaps with orthographic projections of at least a part of the first conductor portion, at least a part of the second conductor portion and the first gate layer on the substrate; and forming a first source/drain layer on a side of the dielectric layer away from the substrate, wherein the first source/drain layer is electrically connected to the first conductor portion, the first gate layer and the second conductor portion, and an orthographic projection of the first source/drain layer on the substrate at least partially overlaps with the orthographic projection of the first via hole on the substrate.

20. The array substrate according to claim 13, wherein the array substrate is implemented in a display panel.

\* \* \* \* \*

UNITED STATES PATENT AND TRADEMARK OFFICE
CERTIFICATE OF CORRECTION

PATENT NO. : 11,469,290 B2
APPLICATION NO. : 17/040260
DATED : October 11, 2022
INVENTOR(S) : Zhongyuan Wu et al.

It is certified that error appears in the above-identified patent and that said Letters Patent is hereby corrected as shown below:

On the Title Page

Item (71), Column 1, Lines 1-2, in the Applicants section, please delete:
"Hefei BOE Joint Technology Co., Ltd., Beijing (CN); BOE TECHNOLOGY GROUP CO., LTD., Beijing (CN)"

And replace with:
"Hefei BOE Joint Technology Co., Ltd., Hefei, Anhui (CN); BOE TECHNOLOGY GROUP CO., LTD., Beijing (CN)"

Signed and Sealed this
Twentieth Day of December, 2022

Katherine Kelly Vidal
*Director of the United States Patent and Trademark Office*